(12) United States Patent
Terauchi

(10) Patent No.: US 6,397,342 B1
(45) Date of Patent: May 28, 2002

(54) DEVICE WITH A CLOCK OUTPUT CIRCUIT

(75) Inventor: Youji Terauchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/249,103

(22) Filed: Feb. 12, 1999

(30) Foreign Application Priority Data

Feb. 17, 1998 (JP) ........................... 10-034971

(51) Int. Cl.$^7$ ................................ G06F 1/04
(52) U.S. Cl. ....................... 713/500; 713/501
(58) Field of Search ................... 713/500, 501, 713/600; 714/724, 731, 744

(56) References Cited

U.S. PATENT DOCUMENTS 5,396,111 A   3/1995   Frangioso et al.

FOREIGN PATENT DOCUMENTS

| DE | 43 12 338 C2 | 3/1994 |
|---|---|---|
| GB | 1561 961 | 3/1980 |
| JP | 60-9221 | 1/1985 |
| JP | 62-274277 | 11/1987 |
| JP | 1-230162 | 9/1989 |
| JP | 1-261845 | 10/1989 |
| JP | 2-135542 | 5/1990 |
| JP | 2-300680 | 12/1990 |
| JP | 3-67379 | 3/1991 |
| JP | 3-153053 | 7/1991 |
| JP | 4-27883 | 1/1992 |
| JP | 5-19892 | 1/1993 |
| JP | 5-302961 | 11/1993 |
| JP | 6-52044 | 2/1994 |
| JP | 8-54955 | 2/1996 |
| TW | 322541 | 12/1997 |

*Primary Examiner*—Dennis M. Butler
(74) *Attorney, Agent, or Firm*—Foley & Lardner

(57) ABSTRACT

A devices is disclosed having at least an internal circuit for performing a predetermined processing and a clock generation circuit for such as an oscillation circuit for providing a clock signal to the internal circuit and other circuits is disclosed. The device has a clock output circuit for receiving a test mode signal and outputting the clock signal or an output from the internal circuit to an output terminal in accordance with the test mode signal. When the test mode signal become active, the clock signal is outputted from the external terminal to perform the test for the clock signal.

8 Claims, 3 Drawing Sheets

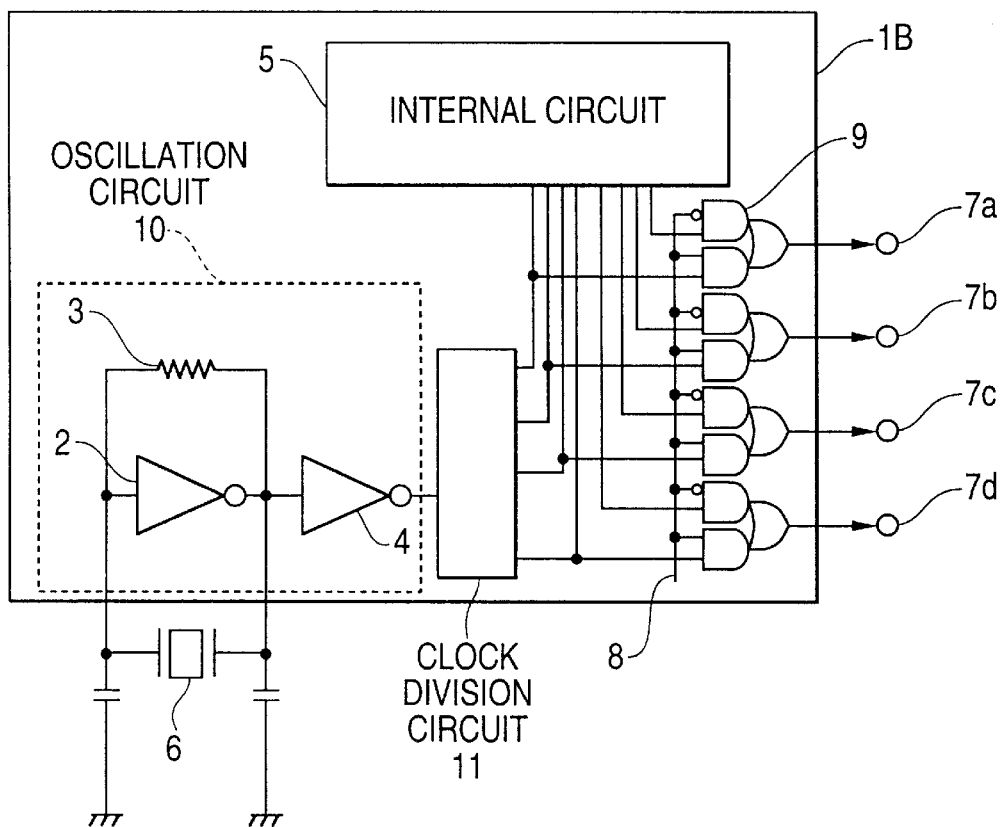

DEVICE WITH A CLOCK OUTPUT CIRCUIT

BACKGROUND OF THE INVENTION

1. Field of the Invention

The present invention relates to a device having an internal circuit for performing a predetermined processing and outputting a signal from an output terminal to the outside and a clock generation circuit such as an oscillation circuit for generating a clock signal and providing the generated clock signal to the internal circuit and other circuits.

2. Description of the Related Art

Conventionally, a test for an oscillation circuit (for example a check for a duty of an output waveform from an oscillation circuit or for a stable time of oscillation) is performed such that, as shown in FIG. 1, microcomputer 1C, including an oscillation circuit 10 (comprising an inverter 2, feedback resistance 3, a hysteresis inverter 4 and an oscillator 6) and an internal circuit 5 (including a CPU, a timer, a serial interface circuit and so on), is provided with a dedicated clock output terminal 12 separately from an output terminal 7 to supply an output waveform from oscillation circuit 10 to the outside of the microcomputer, and the waveform is observed by means of an oscilloscope.

Alternatively, as shown in FIG. 2, a CPU 5a is operated in a test mode such as a romless mode, in which a transmission clock 5c synchronized with a certain group of divided clocks 11a is outputted from a serial interface circuit 5b to the outside of a microcomputer 1C, for example. The clock is observed to thereby indirectly validate the operation of a clock division circuit 11.

The above-mentioned prior arts, however, have the following disadvantages: Firstly, a dedicated test terminal is required other than a terminal used during normal operation. Secondly, the test is more complicated when the internal circuit is operated for test because a dedicated instruction is required when the internal circuit is operated.

SUMMARY OF THE INVENTION

It is an object of the present invention to provide a device of the type described above which does not require a dedicated test terminal and is capable of performing a test for a clock signal in a simple manner.

In order to achieve the above object, the present invention has, in a device, a clock output circuit for receiving a test mode signal and outputting a clock signal or an output signal from an internal circuit to an output terminal in accordance with the test mode signal.

Thus, a dedicated test mode and the clock output circuit make it possible to easily perform the test for an internal clock without providing a dedicated terminal.

The above and other objects, features and advantages of the present invention will become apparent from the following description with reference to the accompanying drawings which illustrate examples of the present invention.

BRIEF DESCRIPTION OF THE DRAWINGS

FIG. 5 is a block diagram showing a second embodiment of the present invention; and FIG. 6 is a timing chart showing the operation of the second embodiment.

DESCRIPTION OF THE PREFERRED EMBODIMENTS

Figure 1:
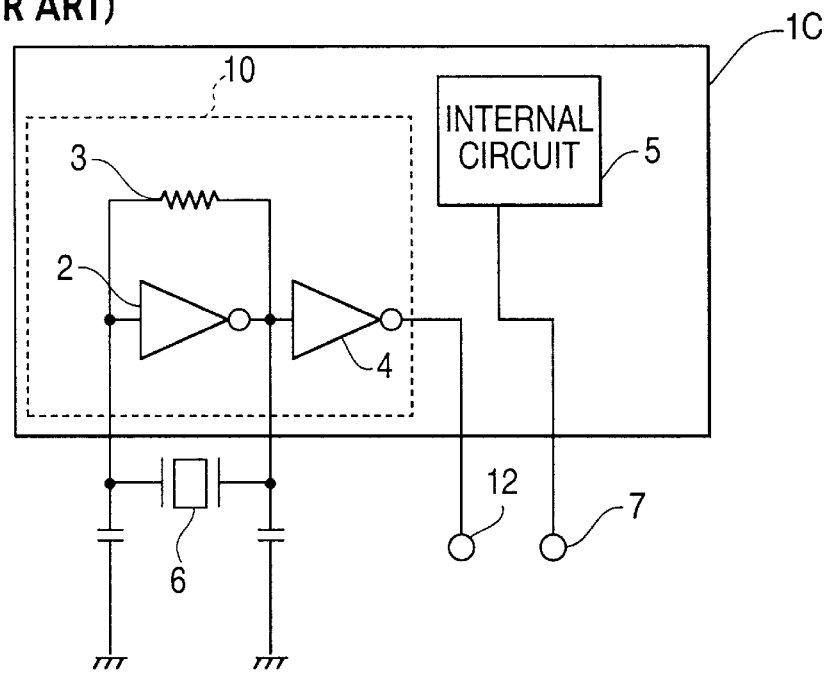
FIG. 1 is a block diagram showing a first prior art.
Figure 2:
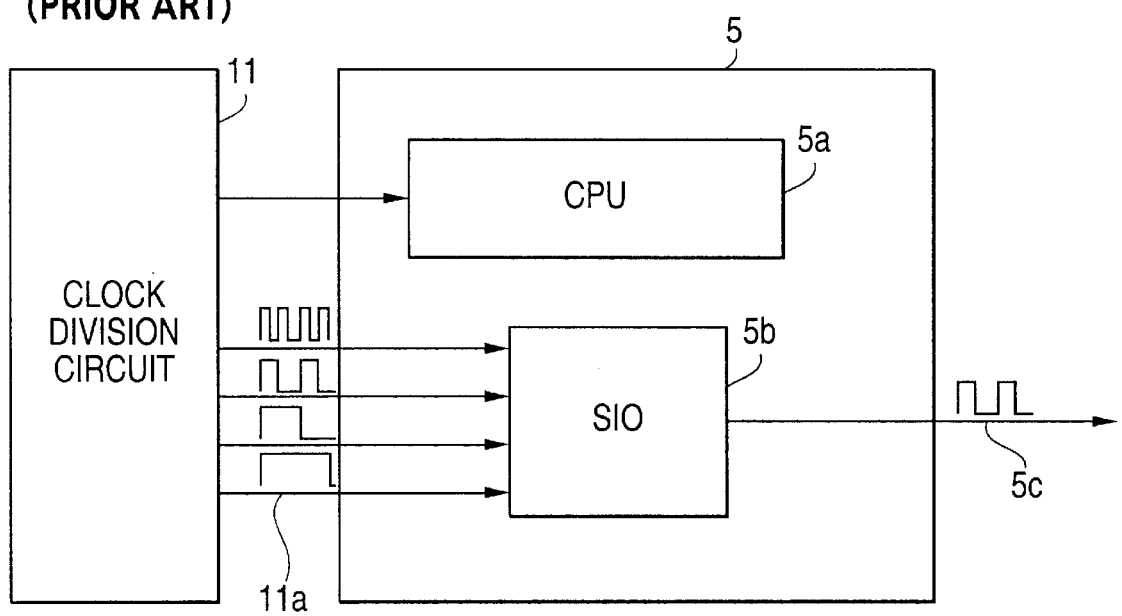
FIG. 2 is a block diagram showing a second prior art.
Figure 3:
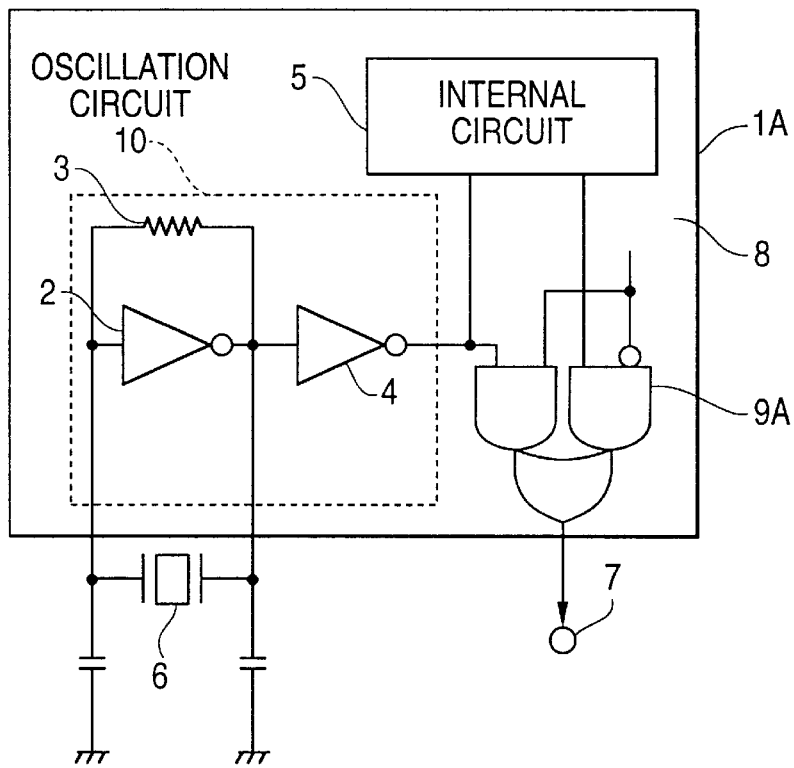
FIG. 3 is a block diagram showing a first embodiment of the present invention.

Referring now to FIG. 3, there is shown a device according to a first embodiment of the present invention as microcomputer 1A.

Microcomputer 1A comprises an internal circuit 5 for performing a predetermined processing; an oscillation circuit 10 for generating a clock signal; a clock output circuit 9A for receiving a test mode signal 8 and outputting the clock signal or an output signal from internal circuit 5 from an output terminal to the outside in accordance with test mode signal 8; and other circuits, (not shown).

Oscillation circuit 10 includes an inverter 2, a feedback resistance 3 and a hysteresis inverter 4. An oscillator is connected between the input and output of inverter 2. Internal circuit 5 includes a CPU, a timer, a serial interface circuit and so on.

Figure 4:
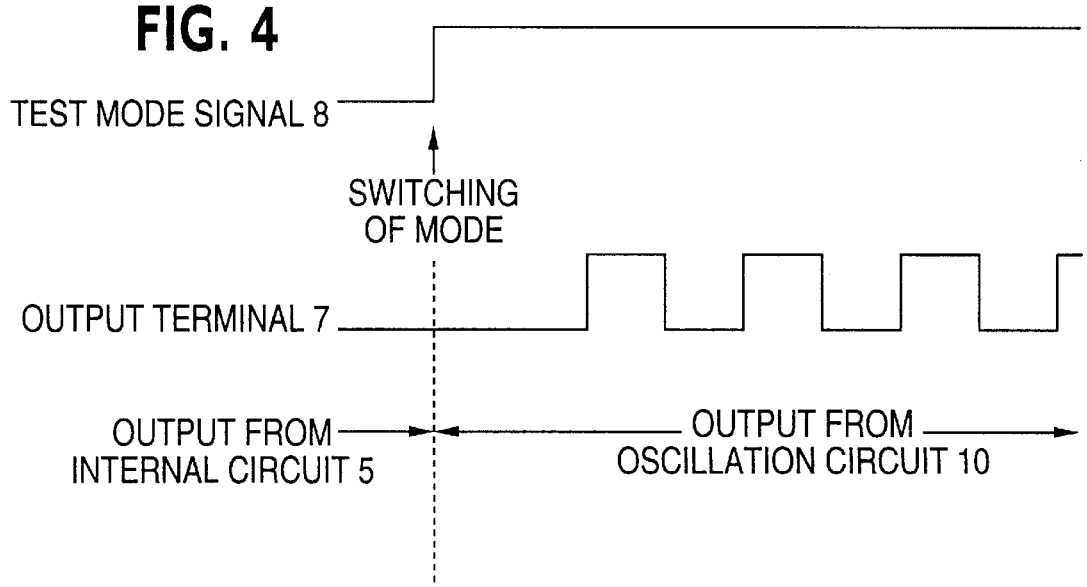
FIG. 4 is a timing chart showing the operation of the first embodiment.

Next, the operation of this embodiment will be described with reference to FIG. 4. Microcomputer 1A is set in a test mode in order to validate an output waveform from oscillation circuit 10. This test mode causes test mode signal 8 to be high-active. When test mode signal 8 becomes active, an output waveform from oscillation circuit 10 is outputted from output terminal 7.

In this embodiment, the terminal for outputting the output waveform of oscillation circuit 10 also serves as output terminal 7 of internal circuit 5 by using clock output circuit 9A, so that an extra terminal need not be added only for the test. Also, since the output from oscillation circuit 10 can be directly observed outside the chip, internal circuit 5 need not be operated for the test and the test can be simplified.

Referring to FIG. 5, a microcomputer 1B according to a second embodiment of the present invention also comprises clock division circuit 11, which receives an output clock from oscillation circuit 10 and divides the received clock into ½ division, ¼ division, ⅛ division and 1/16 division, respectively, to be provided to internal circuit 5 and clock output circuit 9B. Clock output circuit 9B switches the respective divided clocks and an internal signal with test mode signal 8 to output the respective divided clocks to output terminals 7a to 7d. It should be noted that in the second embodiment, the number of output terminals 7a to 7d and a group of components of the clock output circuit need not be four and the output terminals and the components may comprise two or more elements as required.

Thus, the clocks from clock division circuit 11 is directly outputted from output terminals 7a to 7d to observe the waveforms thereof, thereby easily performing the test for clock division circuit 11 without operating internal circuit 5.

While preferred embodiments of the present invention have been described using specific terms, such description is for illustrative purposes only, and it is to be understood that changes and variations may be made without departing from the spirit or scope of the following claims.

What is claimed is:

1. A device comprising:

internal circuit means for performing a predetermined processing and outputting a signal from an output terminal thereof to the outside;

an oscillation circuit for generating a clock signal and providing the generated clock signal to said internal circuit means and other circuit means; and clock output circuit means for receiving a test mode signal, directly receiving said clock signal from said oscillation circuit, and outputting the clock signal or the output signal from said internal circuit means to the output terminal in accordance with the test mode signal.

2. The device according to claim 1, wherein said device is a microcomputer, and said internal circuit means includes at least a CPU.

3. The device according to claim 2, wherein said clock output circuit means includes a first AND circuit for receiving the output clock from the oscillation circuit and the test mode signal or an inversion signal thereof, a second AND circuit for receiving the output from said internal circuit means and the inversion signal of the test mode signal or a noninversion signal thereof, and an OR circuit for receiving outputs from the first and second AND circuits and providing an output to the output terminal.

4. The device according to claim 1, wherein said clock output circuit means directly receives the test mode signal.

5. A device comprising:

an internal circuit for performing a predetermined processing and outputting a signal from an output terminal thereof to the outside;

an oscillation circuit for generating a clock signal and providing the generated clock signal to said internal circuit and other circuits; and a clock output circuit for receiving a test mode signal, directly receiving said clock signal from said oscillation circuit, and outputting the clock signal or the output signal from said internal circuit to the output terminal in accordance with the test mode signal.

6. The device according to claim 5, wherein said device is a microcomputer, and said internal circuit includes at least a CPU.

7. The device according to claim 6, wherein said clock output circuit includes a first AND circuit for receiving the output clock from the oscillation circuit and the test mode signal or an inversion signal thereof, a second AND circuit for receiving the output from said internal circuit and the inversion signal of the test mode signal or a noninversion signal thereof, and an OR circuit for receiving outputs from the first and second AND circuits and providing an output to the output terminal.

8. The device according to claim 6, wherein said clock output circuit directly receives the test mode signal.

* * * * *